United States Patent [19]

Weyrich et al.

[11] 4,149,914
[45] Apr. 17, 1979

[54] METHOD FOR DEPOSITING EPITAXIAL MONOCRYSTALLINE SEMICONDUCTIVE LAYERS VIA SLIDING LIQUID PHASE EPITAXY

[75] Inventors: Claus Weyrich, Gauting; Werner Hosp, Munich, both of Fed. Rep. of Germany

[73] Assignee: Siemens Aktiengesellschaft, Berlin & Munich, Fed. Rep. of Germany

[21] Appl. No.: 914,167

[22] Filed: Jun. 9, 1978

[30] Foreign Application Priority Data

Jul. 5, 1977 [DE] Fed. Rep. of Germany ....... 2730358

[51] Int. Cl.² ......................................... H01L 21/208
[52] U.S. Cl. ..................................... 148/171; 148/172; 118/415
[58] Field of Search ................. 148/171, 172; 118/415

[56] References Cited

U.S. PATENT DOCUMENTS

| 3,753,801 | 8/1973 | Lockwood et al. | 148/171 |
|---|---|---|---|
| 3,854,447 | 12/1974 | Kobayasi | 118/421 |
| 3,899,371 | 8/1975 | Ladany et al. | 148/171 |
| 3,909,317 | 9/1975 | Itoh et al. | 148/171 |
| 3,933,538 | 1/1976 | Akai et al. | 148/171 |
| 4,028,148 | 6/1977 | Horikoshi | 148/171 |
| 4,072,544 | 2/1978 | DeWinter et al. | 148/171 |

*Primary Examiner*—G. Ozaki
*Attorney, Agent, or Firm*—Hill, Gross, Simpson, Van Santen, Steadman, Chiara & Simpson

[57] ABSTRACT

A method of depositing a plurality of epitaxial monocrystalline layers of semiconductive materials onto an individual substrate of a plurality of substrates via the sliding liquid phase epitaxy technique whereby the spacing between respective melt-containing chambers and respective substrate-receiving recesses are substantially equal to one another and, during the deposition stage, the temperature of all melts located on respective substrates is lowered a substantially identical amount so that a corresponding epitaxial layer grows on each such substrate.

2 Claims, 2 Drawing Figures

METHOD FOR DEPOSITING EPITAXIAL MONOCRYSTALLINE SEMICONDUCTIVE LAYERS VIA SLIDING LIQUID PHASE EPITAXY

BACKGROUND OF THE INVENTION

1. Field of the Invention

The invention relates to a method of depositing epitaxial monocrystalline layers in accordance with sliding liquid phase epitaxy and somewhat more particularly to such a method wherein a plurality of substrates are substantially simultaneously provided with multiple epitaxial semiconductive layers.

2 Prior Art

In the production of certain specific semiconductor components, for example, luminescent diodes or laser diodes, it is necessary to epitaxially deposit one or more layers of a semiconductive material on a substrate, such as a semiconductor crystal. Particularly, in the production of semiconductor components composed of intermetallic III-V compounds and their mixed crystals, the technique of sliding liquid phase epitaxy is typically utilized.

Generally, in this method a melt containing the semiconductive material to be deposited is moved onto a surface of a substrate with the aid of a slider or the like and the material is deposited on such surface in a monocrystalline condition by subjecting the arrangement to a slight cooling. As soon as a desired thickness of the monocrystalline layer is obtained via such deposition, the residual melt is removed or pushed-off from the substrate surface or from the newly formed epitaxial layer with the aid of the slider means. Such a sliding liquid phase epitaxial technique and an arrangement for practicing such technique are described, for example, in U.S. Pat. No. 3,753,801.

In order to produce coherent and incoherent radiating double heterostructured diodes, for example, of a (Ga, Al) As-GaAs diode or microwave elements having a heterostructure, it is necessary to epitaxially deposit a plurality of layers one on top of the other on a given substrate. These layers differ from one another in their respective compositions, for example, in a GaAs-GaAl-As layer sequence, such layers may differ in the aluminum concentration within the various layers.

Layer sequences such as are, for example, required for double heterostructure laser diodes or luminescent diodes, are normally produced with suitable sliding equipment in which substrate discs are located in suitably designed indentations or recesses within a so-called furnace "boot", generally composed of graphite, which is operationally associated with a moveable slide member having a plurality of melt-receiving chambers for receiving melts of different compositions. In this type of equipment, the substrate discs are consecutively, in a linear or concentric manner, spaced a select distance from one another in the boot and the melt-receiving chambers of the slide member are also consecutively spaced from one another. By linearly sliding or concentrically turning the slide member, the respective melts are consecutively moved across the respective substrates and a monocrystalline epitaxial layer grows on the substrate surfaces when the melt is cooled by a specific amount. The thickness of a so-grown layer is generally determined by the magnitude of the temperature drop of the melt and by the thickness of the melt over the substrate. Further, as long as a controlled temperature drop occurs within the melt containing the materials or compounds being epitaxially grown, the thickness of the so-grown layers is also determined by the rate of cooling the melt the desired amount. If extremely thin layers are to be deposited on a substrate, melts must be utilized for the deposition process which are saturated with the material forming the substrate so that an uncontrolled dissolving of the substrate material at the surface of the substrate does not occur, which would cause an uncontrolled layer growth. A precise saturation of the melt is most readily produced in a respective melt by a dissolving or compositional material balance between the melt and the material of the substrate, for example by providing a sufficiently long contact time between a "pre-substrate" (composed of an identical material as the substrate) and the melt before the actual substrate is moved into the growth position. In apparatuses where several substrate discs are to be simultaneously provided with a multi-layered structure, a separate recess must be provided in the sliding means for each substrate disc along with a separate chamber for each layer to be deposited. Thus, for example, in order to produce a four-layered structure on a substrate in which respectively different cooling intervals must be utilized in order to deposit individual layers, a slider must be provided having a sufficient number of individual chambers to correspond to four times the number of substrate discs to be layered. Clearly, this leads to very complicated constructions of the slide or of the "boot", even with relatively small number of substrate discs. Additionally, the relatively large chamber number in such a device could easily lead to serious mistakes in loading such "boots". Finally, because of the necessity of "pre-substrates" via this technique, the number of substrate discs is doubled and, necessarily, additionally increase the cost of the overall process.

SUMMARY OF THE INVENTION

It is an object of the invention to provide a method of depositing epitaxial monocrystalline semiconductive layers in accordance with the sliding liquid phase epitaxy whereby several substrate discs are substantially simultaneously provided with a multi-layered epitaxial structure without requiring pre-substrates and which permits a decrease in the number of chambers required within a slide member required for moving the melts during such process.

In accordance with the principles of the invention, a plurality of monocrystalline epitaxial layers of semiconductive material are substantially simultaneously deposited on a plurality of substrates via sliding liquid phase epitaxy using a furnace boot having a plurality of spaced-apart substrate-receiving recesses therein and a melt-carrying slide having a plurality of spaced-apart melt-receiving chambers associated with such boot so that a surface of such boot forms the bottom of such chamber whereby deposition of the individual epitaxial layers occurs by providing a melt containing a desired semiconductive material to be deposited within each of the chambers and providing a substrate within each of the recesses while controllably moving the boot so that a respective melt contacts a respective substrate and controllably lowering the temperature of a respective melt located on a respective substrate to produce a layer of the semiconductive material on such substrate. The invention particularly is characterized wherein in such an arrangement the melt-receiving chambers and the substrate-receiving recesses are arranged in a regular spaced-apart manner so that the spacing between such recesses is equal to the spacing between such chambers and during each deposition stage, the temperature of all melts respectively located on respective substrates is lowered a substantially identical amount.

In accordance with the principles of the invention, the thickness of a deposited monocrystalline layer on a respective substrate is regulated by controlling the thickness of the melt located on such substrate. In accordance with the principles of the invention, the minimum contact time, $t_{min}$, between a respective melt and a respective substrate is of a magnitude defined by the equation:

$$t_{min} = \frac{W_{max}^2}{D}$$

wherein $W_{max}$ is the greatest thickness of the melt in contact with the substrate and D is the diffusion coefficient of the semiconductive material within the melt.

An advantage of the invention comprises that the individual epitaxial layers are deposited on respective substrate discs from the same melt and that, furthermore, the temperature drop in individual melts respectively occurs by the same amount or degree. In order to control the thickness of the respectively deposited layers, the thickness of a melt situated above and across a substrate disc is selectively varied or controlled. The respective melt from which a respective layer is to be deposited in monocrystalline condition remains on the substrate surface for a sufficient time for the melt to achieve a balance with such surface. The substrate discs to be layered are spaced, in accordance with the principles of the invention, consecutively at the same distance as the distance between the melt-receiving chamber in the slide member. The substrates and/or the melt-receiving chambers, respectively, may be arranged linearly or in a concentric fashion.

In the practice of the invention, during a first deposition stage wherein a first monocrystalline layer is deposited or grown, a first melt containing a select semiconductor material is moved onto a first substrate surface. If necessary, such first melt may be brought into a solution balance via a "pre-substrate" however, this type of process is typically not required. After such first melt has been moved onto the first substrate, the overall arrangement or device is cooled a specific amount, such as defined by a temperature interval, $\Delta T$, which, for example, may be about 1° C. The semiconductive material dissolved in a melt is then epitaxially deposited on the substrate surface. The melt is left on the substrate surface for a sufficient length of time so that the melt reaches a solution balance dominant at this new temperature, i.e., until the melt is exhausted for deposition of the desired semiconductive material. One can conclude from the foregoing that the growth of a layer from a melt is determined by the diffusion coefficient of the material dissolved in a melt. For example, in the deposition of GaAs by the diffusion coefficient of As in the Ga melt. In that case, the minimum contact time of the melt on the substrate after the select cooling is completed may be defined by the equation:

$$t_{min} = \frac{W_{max}^2}{D}$$

wherein $t_{min}$ is the minimum contact time, $W_{max}$ is the greatest thickness of the melt utilized for the deposition and in contact with the substrate and D is the diffusion coefficient of the dissolved material in the melt. A presupposition upon which the validity of the above equation is based is that the equation $\alpha \cdot \Delta T < t_{min}$ is true wherein $\Delta T$ is the specific temperature drop, $\alpha$ is the cooling rate, and $t_{min}$ is the minimum contact time. Further, if the equation $\alpha \cdot \Delta T > t_{min}$ is true, instead of the previous equation, the minimum contact duration can even be held correspondingly shorter after the cooling is completed. If the cooling rate of the melt is held sufficiently low, a contact time between a melt and a substrate without a substantially simultaneous temperature drop could be completely avoided. Since the melts being moved onto the substrates for depositing of respective layers are maintained at different thicknesses, in spite of the same cooling interval for all melts, nevertheless different thickness layers can be grown on the respective substrate discs, as a thickness of a respectively deposited layer under the given conditions is proportional to the thickness of the melt located across a respective substrate disc. With a cooling drop of, for example, $\Delta T = 1°$ C., and an initial temperature of, for example, 800° C., the thickness of a melt must approximate about 1 mm for a deposition of GaAs from a Ga-As melt in order to grow a GaAs layer having a thickness of about 1 $\mu$m wherein the contact time, in accordance with the earlier defined equation must amount to approximately 200 seconds, where D approximately is equal to $5 \times 10^{-5}$ cm·sec$^{-1}$. After this contact time, the first melt is then pushed or moved onto a second substrate by means of advancing the slide member and a second melt is substantially simultaneously moved onto the first substrate in order to deposit a second layer thereon. The overall arrangement is again cooled by the same amount, thus, in the above-discussed exemplary embodiment, by 1° C. Thereafter, the first melt is further advanced onto a third substrate while the second melt is moved onto the second substrate and a third melt is moved onto the first substrate and the overall arrangement cooled, for example, by 1° C. These individual deposition steps or stages are continued in accordance with the number of available substrates and the number of layers to be deposited. If, for example, 10 substrates are to be provided with a four-layered structure, four melt-receiving chambers must be provided for the individual melts and 15 sliding steps or stages are necessary in total to achieve such structure. In this instance, a total cooling of 15° C. occurs upon completion of the process if the cooling proceeds by 1° C. for each individual deposition stage. Within a temperature interval of 15° C., the solubility (which is temperature dependent) or the distribution coefficient of the respective components (which may include doping materials) within the melt can be neglected so that the deposited layers have substantially equal thicknesses on substrates.

DETAILED DESCRIPTION OF PREFERRED EMBODIMENTS

Figure 1:
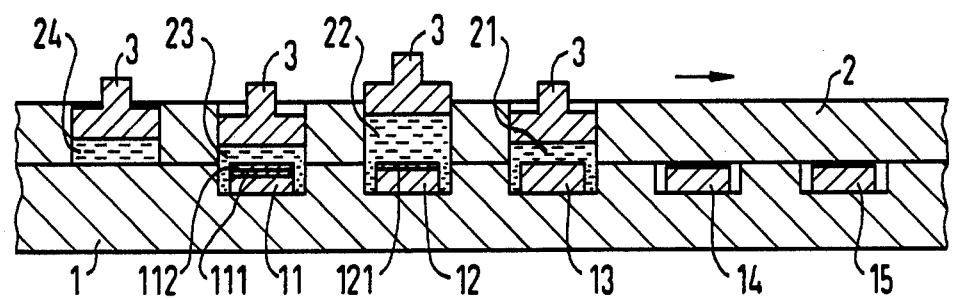
FIG. 1 is a somewhat schematic cross-sectional view of an apparatus suitable for practicing an embodiment of the invention.

FIG. 1 generally illustrates an apparatus suitable for carrying out an embodiment of the invention. The apparatus is shown during a deposition process selected to produce a four-layer structure on GaAs substrate with the third stage of the deposition process having been completed at the first deposition station.

As indicated above, the monocrystalline epitaxial layers produced in accordance with the invention may be comprised of semiconductive compounds or mixed crystals composed of elements from Group III-V of the Periodic Chart of the Elements and in such instances, a given melt may be composed of a Group III element and contain a Group V element dissolved therein.

As will further be appreciated, only such components or elements of the overall device are illustrated as are necessary for a complete understanding of the invention. Accordingly, such more or less conventional components as heating means, drive means, energization means, encompassing housing means, ambient atmosphere control means, other control means, etc. are all omitted but are generally to be understood as being encompassed within the terms "operational arrangement" or "operational device". Thus, as shown, an operational device is comprised of a furnace "boot" member 1 and an operationally associated slide member 2, both of which may be composed of, for example, graphite. The boot member 1 is provided with a plurality of suitably sized substrate-receiving recesses along an upper surface thereof and which are equally spaced from one another a select distance. Suitable substrates, such as GaAs substrate discs 11, 12, 13, 14 and 15 are positioned within the respective substrate-receiving recesses in boot member 1. The slide member 2 is provided with, for example, four melt-receiving chambers which are equally spaced from one another a distance corresponding to the spacing of the substrate-receiving recesses. The bottom of each chamber is open so that when a respective chamber is moved, as by a controllable power means associated with the slide member 1, over a given recess, the bottom wall of the recess defines the bottom of the chamber. Suitably selected melts 21, 22, 23 and 24 containing desired semiconductive materials (including dopants) are positioned within their respective chambers, from right to left in the arrangement shown. The thickness of each respective melt over a respective substrate may be readily adjusted as desired, by merely controlling the amount of a melt material provided within each chamber. Pressure-applying means 3 may be provided over each melt to insure that such melt, particularly when thickness thereof is relatively small, does not form droplets or the like due to surface tension but remains as a layer across an associated substrate surface.

During a deposition process for producing a four-layered structured on each substrate, which comprises an exemplary embodiment of the invention, after suitably loading select melts and substrates within the boot member 1 and the slide member 2 and energizing the overall operational device, the slide member is first moved into a first deposition stage or position whereby melt 21 is located over substrate 11 and all other melts are to the left thereof and the other substrates are not associated with any melt. This arrangement (or at least the portion thereof containing the melt 21 and the substrate 11) is controllably cooled a select amount so that a first epitaxial monocrystalline layer 111 is deposited onto the surface of substrate 11. Thereafter, the slide member 2 is controllably moved into the next deposition stage or position so that melt 21 is over substrate 21 while melt 22 is moved over substrate 11. The temperature of this overall arrangement is again controllably dropped a select amount, approximately equal to 1° C. in the embodiment hereunder discussion. In this manner, a first epitaxial monocrystalline layer 121 is desposited on substrate 12 from the melt 21 while a second epitaxial monocrystalline layer 112 is deposited on substrate 11 from melt 22. In the next deposition stage, the slide member 2 is again controllably moved further in a direction of arrow so that melt 21 is located over the third substrate 13, while melt 22 is located over the second substrate 12 and melt 23 is located over the first substrate 11. This stage of the deposition process is the one illustrated at FIG. 1. The temperature of this arrangement, or at least in appropriate portions thereof, is again dropped by $\Delta T$, which in the embodiment under discussion amounts to 1° C. After equilibrium is attained, a first epitaxial monocrystalline layer is deposited on substrate 13 while a second epitaxial monocrystalline layer is deposited on substrate 12 and a third epitaxial monocrystalline layer is deposted on substrate 11. Thereafter, the slide means 2 is again moved further to the next deposition stage so that melt 21 is now located over substrate 14 and melt 24 is located over substrate 11 while the other respective melts, 22 and 23 are located over the substrates 12 and 13. The cooling and moving process is continued in a corresponding manner until all of the substrates are provided with the desired four-layered structure. Of course, other such layered structures may be produced in a similar manner by providing appropriately spaced melts and substrates and controllably cooling such melts a select identical amount at each deposition stage.

Figure 2:
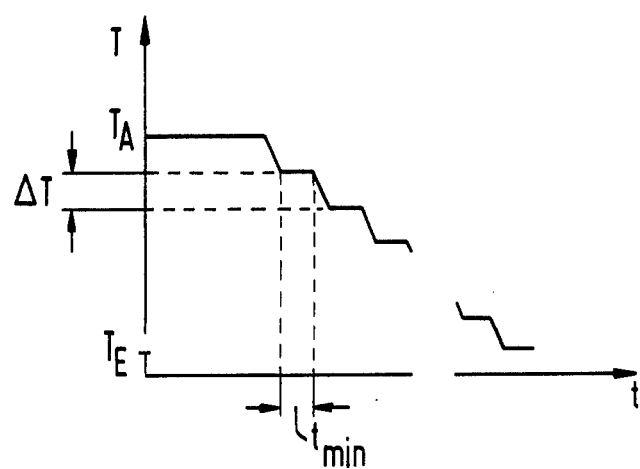
FIG. 2 is a somewhat schematic graphical illustration showing how the temperature of an overall system is lowered in order to deposit individual layers onto respective substrates in accordance with the principles of the invention.

FIG. 2 graphically illustrates the temperature gradient of an overall deposition process during, for example, the production of the above four-layered heterostructured semiconductor crystal. In such a process, the initial temperature, $T_A$, may, for example, be about 800° C. Then, corresponding to the number of substrates to be coated or layered and the number of layers to be deposited, a step-wise temperature drop, each proceeding by a substantially identical amount, $\Delta T$, for example, 1° C., is caused to occur. The final temperature, $T_E$, may, for example, be about 15° C. lower than the initial temperature, $T_A$, in a deposition process wherein ten substrates are each coated with a four-layered structure.

As is apparent from the foregoing specification, the present invention is susceptible of being embodied with various alterations and modifications which may differ particularly from those that have been described in the preceding specification and description. For this reason, it is to be fully understood that all of the foregoing is to be intended to be merely illustrative and is not to be construed or interpreted as being restrictive or otherwise limiting of the present invention, except as it is set forth and defined in the hereto-appended claims.

We claim as our invention:

1. In a method of depositing a plurality of monocrystalline epitaxial layers of semiconductive material onto a plurality of substrates via sliding liquid phase epitaxy in an operational arrangement including a furnace boot having a plurality of spaced apart substrate-receiving recesses therein and a melt-carrying slide member having a plurality of spaced apart melt-receiving chambers therein associated with such boot so that a surface of the boot forms the bottom of such chambers whereby deposition of individual epitaxial layers on individual substrates occurs by providing a melt containing a desired semiconductive material within each of the melt-receiving chambers and providing a select substrate within each of the substrate-receiving recesses, operationally energizing such arrangement so that controlled movement of the slide member relative to the boot occurs whereby a respective melt is brought into contact with a respective substrate and a controlled lowering of the temperature of such respective melt occurs so as to produce an epitaxial layer on such substrate, the improvement comprising:

arranging said melt-receiving chambers and said substrate-receiving chambers in a regularly spaced-apart manner so that the spacing between such recesses is equal to the spacing between such chambers;

maintaining a thickness of a respective melt located on a respective substrate at a dimension corresponding to a desired thickness of a deposited monocrystalline layer on such substrate; and controllably cooling all melts respectively located on respective substrates a substantially identical amount during each deposition stage wherein a minimum contact time is maintained between a moving-on of a respective melt onto a respective substrate and a moving-off therefrom, the magnitude of said minimum contact time being defined by the equation:

$$t_{min} = \frac{W_{max}^2}{D}$$

wherein
- $t_{min}$ is the minimum contact time;
- $W_{max}$ is the greatest thickness of such melt over such substrate; and
- D is the diffusion coefficient of the semiconductive material within such melt.

2. In a method as defined in claim 11 wherein said monocrystalline epitaxial layers are composed of semiconductive compounds and mixed crystals formed of elements selected from Group III-V of the Periodic Chart of the Elements and are deposited from a melt composed of a Group III element and which contains a Group V element dissolved therein.

* * * * *